United States Patent
Shahin et al.

(10) Patent No.: US 10,958,038 B2
(45) Date of Patent: Mar. 23, 2021

(54) EDGE-EMITTING LASER WITH HIGH-FREQUENCY MODULATED REFLECTOR SECTION

(71) Applicant: Microsoft Technology Licensing, LLC, Redmond, WA (US)

(72) Inventors: Shiva Shahin, Seattle, WA (US); Dale Eugene Zimmerman, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/417,439

(22) Filed: May 20, 2019

(65) Prior Publication Data

US 2020/0373734 A1    Nov. 26, 2020

(51) Int. Cl.
| | | |
|---|---|---|
| H01S 5/062 | (2006.01) | |
| H01S 5/40 | (2006.01) | |
| H01S 5/12 | (2021.01) | |
| H01S 5/125 | (2006.01) | |

(52) U.S. Cl.
CPC .............. H01S 5/062 (2013.01); H01S 5/125 (2013.01); H01S 5/1234 (2013.01); H01S 5/4031 (2013.01)

(58) Field of Classification Search
CPC ...... H01S 5/062; H01S 5/4031; H01S 5/1234; H01S 5/125
See application file for complete search history.

(56) References Cited

U.S. PATENT DOCUMENTS

| | | | | |
|---|---|---|---|---|
| 5,418,802 | A  * | 5/1995 | Chwalek | G02F 1/035 372/102 |
| 6,480,513 | B1 * | 11/2002 | Kapany | H01S 5/146 372/102 |
| 8,274,522 | B2 * | 9/2012 | Brown | G02B 26/0816 345/560 |
| 2002/0093995 | A1 * | 7/2002 | Tayebati | H01S 5/141 372/20 |
| 2003/0002138 | A1 * | 1/2003 | DeCusatis | H01S 3/302 359/334 |
| 2009/0051828 | A1 * | 2/2009 | Brown | H04N 1/50 348/745 |
| 2009/0067459 | A1 | 3/2009 | Mizuuchi et al. | |
| 2009/0129414 | A1 * | 5/2009 | Gollier | H04N 9/3158 372/20 |
| 2009/0190618 | A1 | 7/2009 | Kuksenkov et al. | |

(Continued)

OTHER PUBLICATIONS

"International Search Report and Written Opinion Issued in PCT Application No. PCT/US20/028021", dated Jul. 16, 2020, 13 Pages.

*Primary Examiner* — Yuanda Zhang
(74) *Attorney, Agent, or Firm* — Alleman Hall Creasman & Tuttle LLP

(57) ABSTRACT

An edge-emitting laser includes an active gain section and a reflector section optically coupled to the active gain section. The active gain section is configured to amplify an optical power of light across a wavelength range. The reflector section is configured to selectively reflect light of a selected wavelength within the wavelength range. The selected wavelength is tunable via high-frequency index modulation of the reflector section. The active gain section and the reflector section collectively form an optical cavity configured to lase coherent light in the selected wavelength.

16 Claims, 8 Drawing Sheets

(56) References Cited

U.S. PATENT DOCUMENTS

| | | | |
|---|---|---|---|
| 2010/0232005 A1* | 9/2010 | Lescure | G02B 27/48 |
| | | | 359/279 |
| 2011/0317130 A1 | 12/2011 | Gollier | |
| 2014/0098010 A1* | 4/2014 | Travis | G02B 6/0031 |
| | | | 345/32 |
| 2014/0300953 A1 | 10/2014 | Whitbread et al. | |
| 2015/0207296 A1* | 7/2015 | Rickman | H01S 5/3427 |
| | | | 372/20 |
| 2019/0056599 A1 | 2/2019 | Reshidko et al. | |

* cited by examiner

EDGE-EMITTING LASER WITH HIGH-FREQUENCY MODULATED REFLECTOR SECTION

BACKGROUND

Laser scanning micro-electro-mechanical systems (MEMS) based displays have several advantages over liquid crystal displays (LCDs) and liquid crystal on silicon (LCOS) displays. Such advantages include smaller size, lighter weight, lower power consumption, and higher brightness and contrast. In a waveguide-based laser scanning display, image light beams emitted from the laser are coupled into one or more waveguides. These light beams propagate through the waveguide(s), while being replicated, and then are coupled out of the waveguide(s) into a user's eyes.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

An edge-emitting laser includes an active gain section and a reflector section optically coupled to the active gain section. The active gain section is configured to amplify an optical power of light across a wavelength range. The reflector section is configured to selectively reflect light of a selected wavelength within the wavelength range. The selected wavelength is tunable via high-frequency index modulation of the reflector section. The active gain section and the reflector section collectively form an optical cavity configured to lase coherent light in the selected wavelength.

DETAILED DESCRIPTION

Compared to other common light sources such as light emitting diodes (LEDs) which work based on a light emission process called spontaneous emission, lasers produce light through stimulated emission. Stimulated emission copies existing photons in an optical cavity, and each copy has the same wavelength as the original. This process results in a narrower spectral bandwidth in lasers compared to LEDs and other light sources that produce light based on spontaneous emission.

Having narrower spectra in lasers causes several challenges in display applications. As one example, a narrow spectral bandwidth may cause high-contrast fringe artifacts in waveguide-based displays. Fringes are formed in waveguide-based displays due to a multitude of possible interactions between coherent laser beams with different optical path lengths. As another example, a laser-based display may present a sharp contrast in the field of view (FOV) boundaries or in the boundaries between different waveguide plates. For a natural user experience, it is preferred that these boundaries are indistinct from their surroundings.

Accordingly, the present disclosure is directed to an edge-emitting laser configured to lase coherent light in a selected wavelength that is tunable within a wavelength range. The selected wavelength may be modulated at a suitably high frequency to broaden the perceived bandwidth of light output from the edge-emitting laser. In one example, the edge-emitting laser includes an active gain section and a reflector section optically coupled to the active gain section. The active gain section is configured to amplify an optical power of light across a wavelength range. The reflector section is configured to selectively reflect light of a selected wavelength within the wavelength range. The selected wavelength is tunable via high-frequency index modulation of the reflector section. The active gain section and the reflector section collectively form an optical cavity configured to lase coherent light in the selected wavelength.

Such an edge-emitting laser may have a perceived spectral bandwidth that is broader than a typical narrow-band laser. Returning to the example of the waveguide-based display discussed above, by using a laser having an increased laser bandwidth, a larger number of wavelengths in the laser spectrum may interfere and the superposition of all the wavelengths results in the washout of the contrast in the interference fringes. In this way, the edge-emitting laser may reduce perception of fringe interference artifacts in images presented by such a waveguide-based display. Turning to the high-contrast boundary issue discussed above, by using a laser having an increased laser bandwidth, light inside the waveguide may couple out at a larger range of angles causing overlap of different wavelengths that blur out the FOV boundaries. In this way, the edge-emitting laser may improve the image quality of images presented by such a waveguide-based display.

Figure 1:
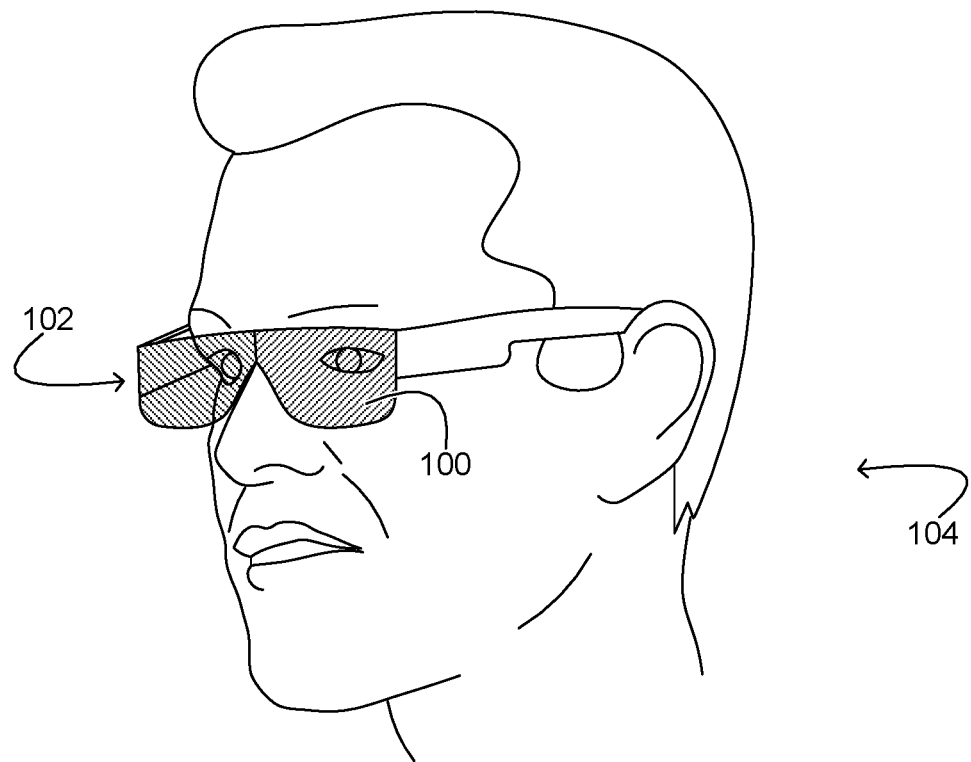
FIG. 1 shows aspects of an example implementation environment for a near-eye display system.

FIG. 1 shows aspects of an example implementation environment for a near-eye display system 100. As illustrated herein, near-eye display system 100 is a component of a head-mounted electronic device 102, which is worn and operated by a user 104. The near-eye display system 100 is configured to present virtual imagery in the user's field of view. In some implementations, user-input componentry of the wearable electronic device 102 may enable the user to interact with the virtual imagery. The wearable electronic device 102 takes the form of eyeglasses in the example of FIG. 1. In other examples, the wearable electronic device 102 may take the form of goggles, a helmet, or a visor. In still other examples, the near-eye display system 100 may be a component of a non-wearable electronic device, such as a heads-up display.

The near-eye display system 100 may be configured to cover one or both eyes of the user 104 and may be adapted for monocular or binocular image display. In examples in which the near-eye display system 100 covers only one eye, but binocular image display is desired, a complementary near-eye display system may be arranged over the other eye. In examples in which the near-eye display system covers both eyes and binocular image display is desired, the virtual imagery presented by near-eye display system 100 may be divided into right and left portions directed to the right and left eyes, respectively. In scenarios in which stereoscopic image display is desired, the virtual imagery from the right and left portions, or complementary near-eye display systems, may be configured with appropriate stereo disparity so as to present a three-dimensional subject or scene.

Figure 2:
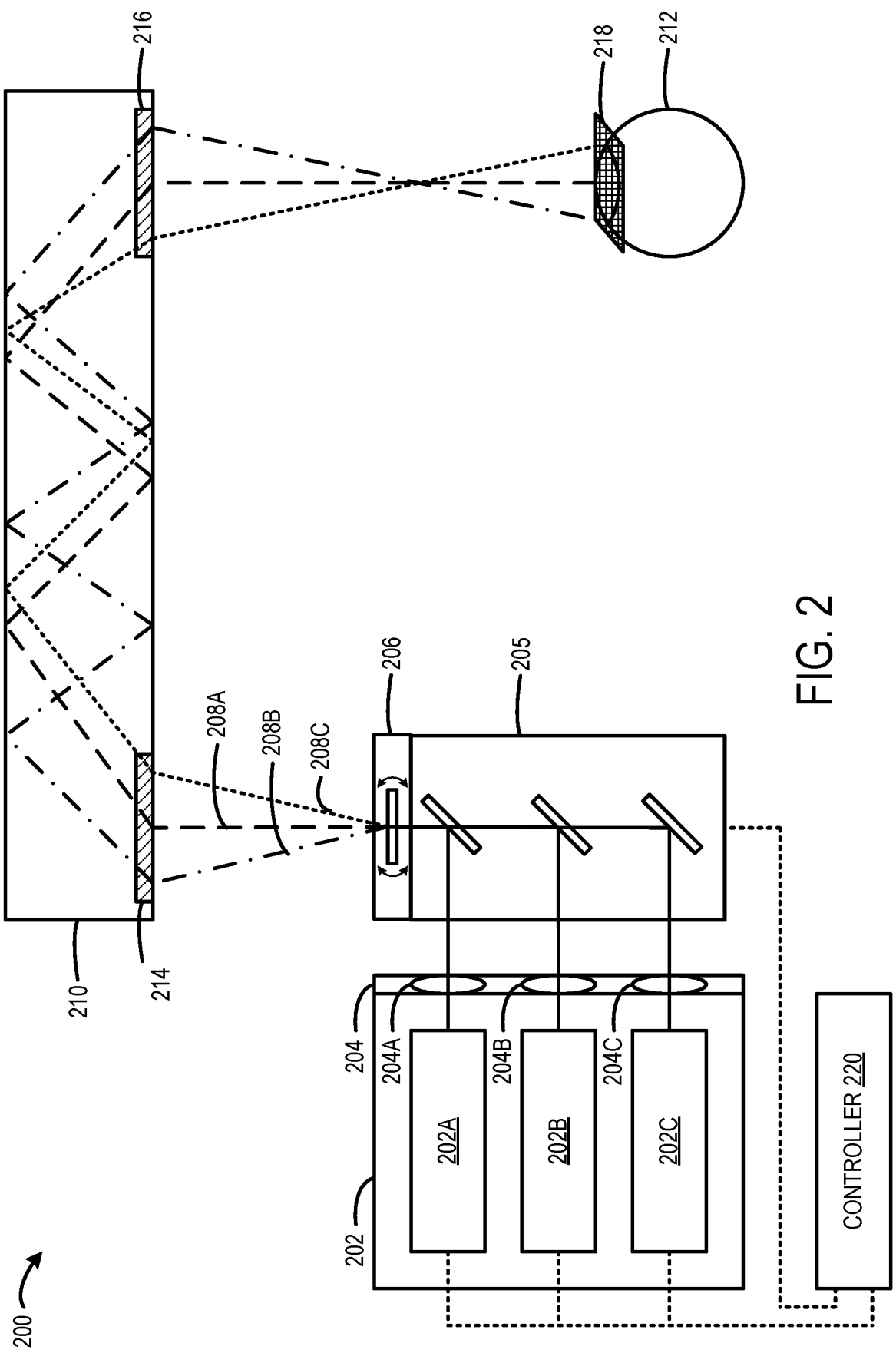
FIG. 2 schematically shows an example near-eye display system.

FIG. 2 shows an example of the near-eye display system 200 that uses a laser assembly 202 as an illumination source. The laser assembly 202 includes lasers 202A (e.g., a red laser), 202B (e.g., a green laser), and 202C (e.g., a blue laser). Although only three lasers are shown, it will be appreciated that the laser assembly 202 may include any suitable number of lasers. For example, the laser assembly 202 may include 0, 1, 2, 3, or more than 3 red lasers; 0, 1, 2, 3, or more than 3 green lasers; 0, 1, 2, 3, or more than 3 blue lasers; and 0, 1, 2, 3, or more than 3 lasers of other colors. Any combination or modification in the number of lasers may also be available (e.g., 2 red, 2 green, 2 blue, or 1 red, 1 green, 2 blue, etc.). Accordingly, any number of lasers may be used to irradiate/illuminate pixels for generating image content.

In some instances (though not all), the laser assembly 202 also includes a collimating lens assembly 204 (or other diffractive optical element) that is structured to direct light to another location or otherwise operate on the light in some manner. In this example, each of the lasers 202A, 202B, and 202C has a corresponding collimating lens 204A, 204B, 204C. In some implementations, however, a single collimating lens may be used for more than one laser.

The near-eye display 200 includes combination optics 205 configured to spatially combine the light beams lased from the plurality of lasers 202A, 202B, and 202C into a single light beam.

The near-eye display system 200 includes a micro-electro-mechanical mirror system (MEMs) 206, though the principles disclosed herein are applicable to any type of laser-based display unit and not only to architectures with the MEMs 206. The MEMs 206 is configured to collect laser light from the combination optics 205, which combines light lased from three different sources (i.e. the lasers 202A, 202B, and 202C). Additionally, the MEMs 206 is configured to direct laser light 208A (which, in this example includes red laser light, green laser light, and blue laser light) to a waveguide 210. Furthermore, the MEMs 206 is configured to redirect its mirrors/mirror array so that the laser light 208A is aimed at different locations at the waveguide 210. As shown, laser lights 208B and 208C are aimed at different locations on the waveguide 210. In this manner, the MEMs 206 is able to route light to different locations by adjusting the aim of its corresponding mirror array. It will be appreciated that the laser lights 208A-C may be modulated to include varying degrees or intensities (or even an absence of any one or more) of red, green, blue, or other color laser light.

The waveguide 210 is configured to redirect or propagate the laser light 208A-C to a desired location which is viewable by a user's eye 212. It will be appreciated that waveguide 210 may be any type of waveguide display (e.g., a surface relief grating waveguide).

The laser light 208A-C enters the waveguide 210 via an entry grating 214. The laser light 208A-C then propagates (e.g., via total internal reflection) through the waveguide 210 until it reaches an exit grating 216. It will be appreciated that the angles with which the laser light 208A-C enters the waveguide 210 are preserved as the laser light 208A-C propagates through the waveguide 210. This condition is shown by the different angles that each of the respective laser lights 208A-C propagate through the waveguide 210. By configuring the entry grating 214 and the exit grating 216 to meet certain design parameters, the MEMs 206 is able to use waveguide 210 to propagate light towards the user's eye 212.

The laser assembly 202 and the MEMs 206 may be controlled by a controller 220. The controller 220 may be configured to control the MEMs 206, in conjunction with the laser assembly 202 to progressively scan a set of pixels 218 to a target display area for a user's eye 212 to view (e.g., by adjusting the mirror array so that the combined RGB laser beam or light is aimed at different locations) individual pixels of that image in such a rapid manner that the entirety of the image appears before the user's eye 212 without the user realizing that the image was progressively scanned pixel by pixel and line by line. In this way, the near-eye display system 200 may project or render image content for a user to view.

The MEMs 206 may be able to scan an image (i.e., pixels of that image) at any image resolution or range of image resolutions (e.g., in cases where foveated rendering is used). For example, in some implementations, the MEMs 206 is configured to scan RGB light from the laser assembly 202 with a resolution of 2,000 pixels by 1,200 pixels, or any other resolution.

Figure 3:
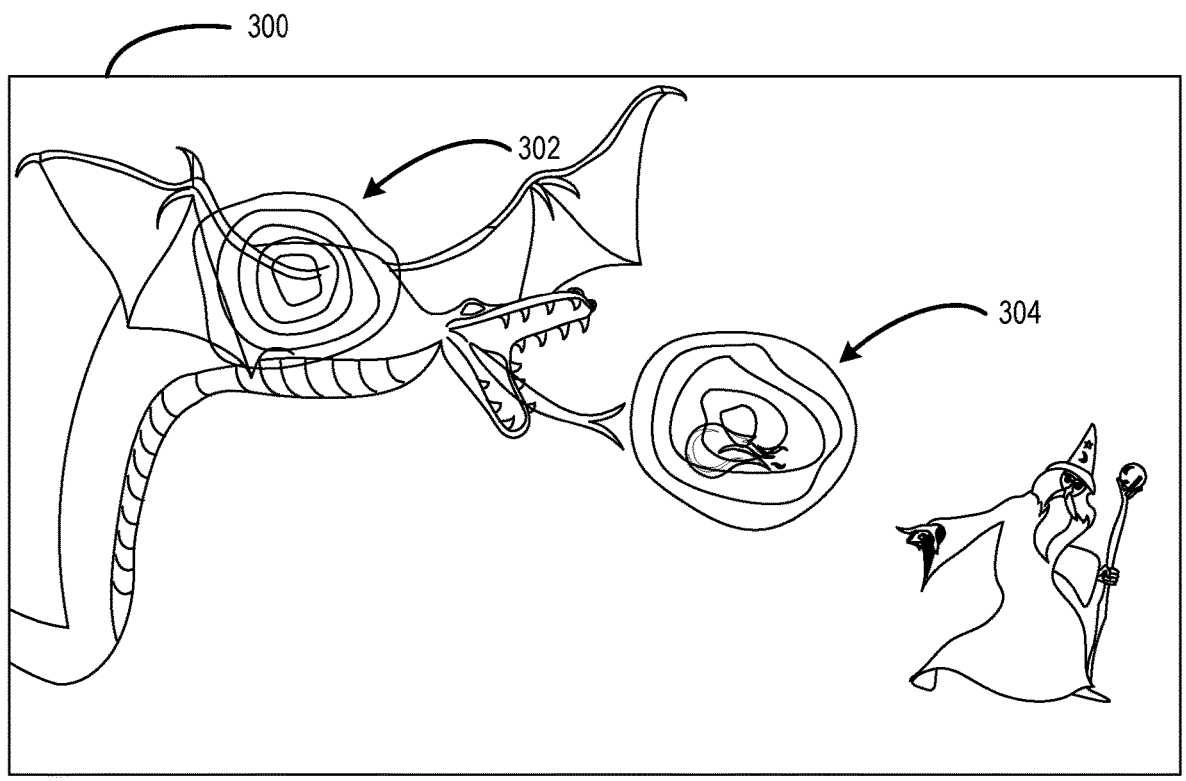
FIG. 3 shows an example image having interference fringe artifacts.

There are various instances in which, due to the wave properties of laser light, fringe interference can occur based on coherent light output from a laser assembly propagating through a waveguide (e.g., waveguide 210 shown in FIG. 2). As a result of such fringe interference, various different artifacts including bright and dark rings/spots may be created in an image output from the waveguide. FIG. 3 shows an example image 300 including artifacts 302 and 304 caused by such fringe interference. The artifacts 302, 304 include irregularities in terms of brightness. The presence of such artifacts in an image can lower the perceived quality of the image and thereby negatively affect the user experience. In the depicted example, the artifact 302 distorts the appearance of a dragon in the image 300. Further, the artifact 304 distorts the appearance of a fireball shot by a wizard at the dragon in the image 300.

In order to reduce fringe interference that creates artifacts in an image output from the waveguide, a laser assembly may be configured to lase coherent light in a selected wavelength. The selected wavelength is rapidly tunable within a wavelength range via high-frequency modulation such that the laser may have a perceived increased bandwidth. By using a laser having an increased perceived laser bandwidth, a larger number of wavelengths in the laser spectrum may interfere and the superposition of all the wavelengths may result in washing out the contrast of the fringe interference.

Figure 4:
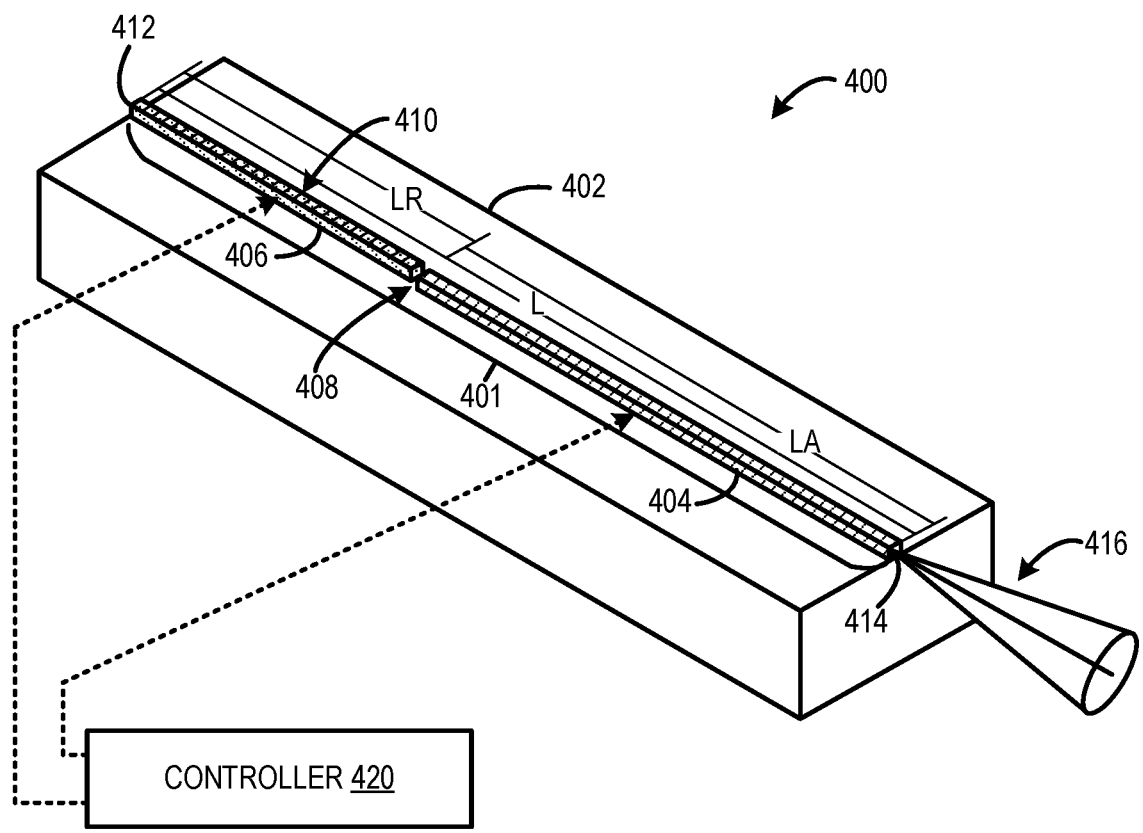
FIG. 4 schematically shows an edge-emitting laser including a reflector section configured to selectively reflect light of a selected wavelength that is tunable within a wavelength range.

FIG. 4 schematically shows an example laser assembly 400 configured to lase coherent light in a selected wavelength that is tunable within a wavelength range. The laser assembly 400 may be representative of any of the lasers 202A, 202B, 202C included in the near-eye display system 200 shown in FIG. 2. The laser assembly 400 includes an optical cavity 401 positioned on a substrate 402. The optical cavity 401 includes an active gain section 404 and a reflector 406 section. The active gain section 404 may be optically coupled to the reflector section 406 via a transmissive interface 408. In the depicted example, the active gain section 404 is edge coupled to the reflector section 406 via the transmissive interface 408. The transmissive interface 408 may be any suitable interface between the two sections of the optical cavity 401 that supports low coupling loss. It will be appreciated that the active gain section 404 may be optically coupled to the reflector section 406 in any suitable manner.

The active gain section 404 is the source of optical gain within the laser assembly 400. The active gain section 404 is configured to amplify an optical power of light reflecting within the optical cavity across a wavelength range. The gain/amplification results from the stimulated emission of electronic or molecular transitions of an active gain medium of the active gain section 404 to a lower energy state from a higher energy state previously populated by a pump source. Laser pumping of the active gain section 404 may be performed using different pump sources, such as electrical currents or light generated by discharge lamps or by other lasers, for example. In one particular example, the active gain section 404 is configured as a reflective semiconductor optical amplifier (RSOA).

The reflector section 406 may be configured to selectively reflect light of a selected wavelength within a wavelength range. The reflector section 406 may include a grating-based filter 410 to facilitate selective reflection across the wavelength range. The reflector section 406 may include any suitable grating-based filter. In one example, the grating-based filter 410 is a Distributed Bragg Grating (DBG). The DBG may be formed from multiple layers of alternating materials with varying refractive index, or by periodic variation of some characteristic (such as height) of a dielectric waveguide, resulting in periodic variation in the effective refractive index of the DBG. Each layer boundary causes a partial reflection of an optical wave. These partial reflections combine with constructive interference, such that the layers of the DBG act as a high-quality reflector. The DBG may be configured to reflect any suitable range of wavelengths.

Furthermore, the reflector section 406 may include electro-optic material 412 that is configured to modulate a reflective index of the reflector section 406 as a function of a voltage of a waveform applied to the electro-optic material 412. In particular, as a voltage of a waveform applied to the electro-optic material 412 varies, the refractive index of the electro-optic material changes under the grating-based filter 410 which shifts the resonant frequency of the grating-based filter 410 to reflect different selected wavelengths of light within the wavelength range of the grating-based filter 410. The reflector section 406 may include any suitable electro-optic material. Non-limiting examples include crystalline electro-optic materials, polymer electro-optic materials, and organic electro-optic materials.

The active gain section 404 includes a selectively reflective end 414. The reflector section 406 and the reflective end 414 may allow coherent light of a selected wavelength to reflect back and forth within the optical cavity. Each time a light beam passes through the active gain section, the optical power of the light beam may be amplified. The selectively reflective end 412 may be partially transparent to allow coherent light 416 to be output from the optical cavity 401.

The optical cavity 401 has an overall length (L). In some implementations, the overall length (L) of the optical cavity 401 may satisfy fringe mitigation requirements while the power consumption is determined mainly by a length (LA) of the active gain section 404. The length (LA) of the active gain section 404 may be determined based on the laser requirement for the particular application. A length (LR) of the reflector section 406 can be selected, given a particular active section length, to provide an overall length (L) that avoids fringe optical path lengths (OPLs) that are imposed by a corresponding waveguide into which the laser assembly 400 lases coherent light. The length (LA) of the active gain section 404, the length (LR) of the reflector section 406, and/or the length (L) of the optical cavity 401 may be any suitable length.

A controller 420 is electrically connected to the active gain section 404 and the reflector section 406. The controller 420 may be configured to control the laser assembly 400 to selectively lase coherent light in a selected wavelength within the wavelength range. In particular, the controller 420 may be configured to selectively apply a current to the active gain section 404 to cause the active gain section 404 to amplify the optical power of light in the optical cavity 401. The controller 420 may be further configured to modulate a voltage of a waveform applied to the reflector section 406 to tune the reflector section 406 to reflect a selected wavelength of coherent light such that coherent light in the selected wavelength may be lased from the optical cavity 401.

Figure 5:
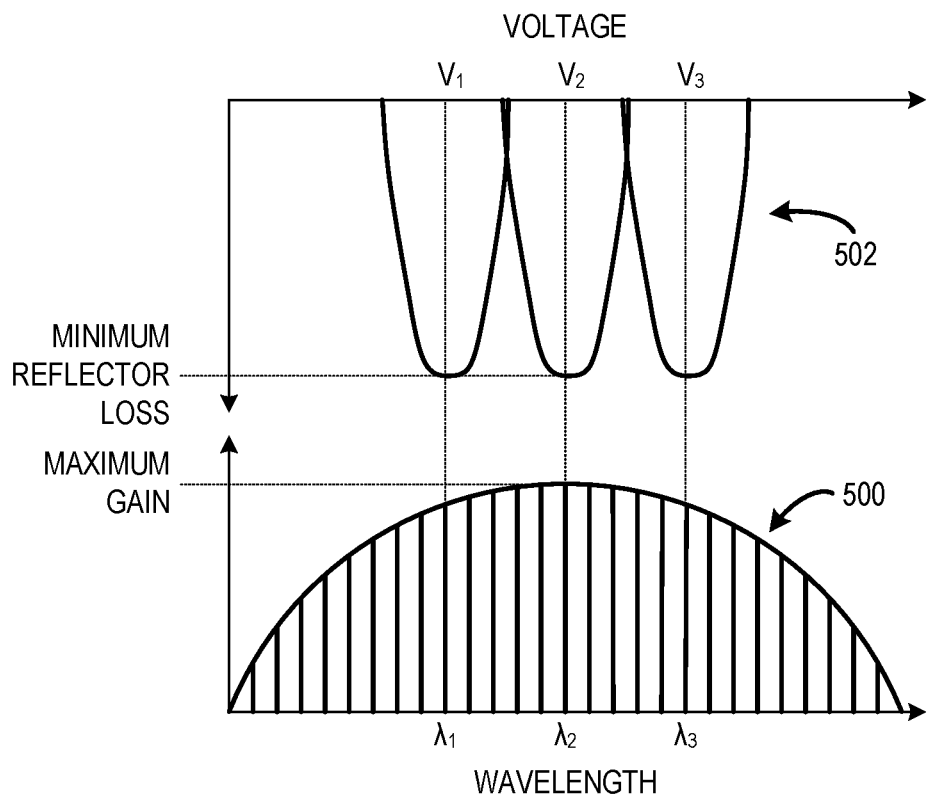
FIG. 5 shows an example laser gain spectrum compared to an example reflector loss spectrum.

The controller 420 may be configured to adjust the voltage to change the selected wavelength of coherent light lased by the optical cavity 401. FIG. 5 depicts an example gain spectrum 500 of the active gain section 404 and an example reflector loss spectrum 502 of the reflector section 406. The gain spectrum 500 includes a plurality of different wavelengths (e.g., $\lambda_1$, $\lambda_2$, $\lambda_3$) at different mode locations within the gain spectrum 500. The heights of the different wavelengths in the gain spectrum 500 indicate an optical gain of light in that wavelength amplified by the active gain section 404. The reflector loss spectrum 502 includes a plurality of different wavelengths to which the reflector section 406 may be tuned to reflect light based on a corresponding voltage (e.g., $V_1$, $V_2$, $V_3$) being applied to the reflector section 406 by the controller 420. For example, the controller 420 may apply voltage $V_1$ to the reflector section 406 to tune the reflector section 406 to reflect light having a wavelength $\lambda_1$. The controller 420 may apply voltage $V_2$ to the reflector section 406 to tune the reflector section 406 to reflect light having a wavelength $\lambda_2$. The controller 420 may apply voltage $V_3$ to the reflector section 406 to tune the reflector section 406 to reflect light having a wavelength $\lambda_3$. The reflector section 406 may be tuned such that a selected wavelength has a minimum loss (i.e., is reflected), and the gain at the selected wavelength becomes greater than the loss such that light at the selected wavelength is lased from the optical cavity 401.

Figure 6:
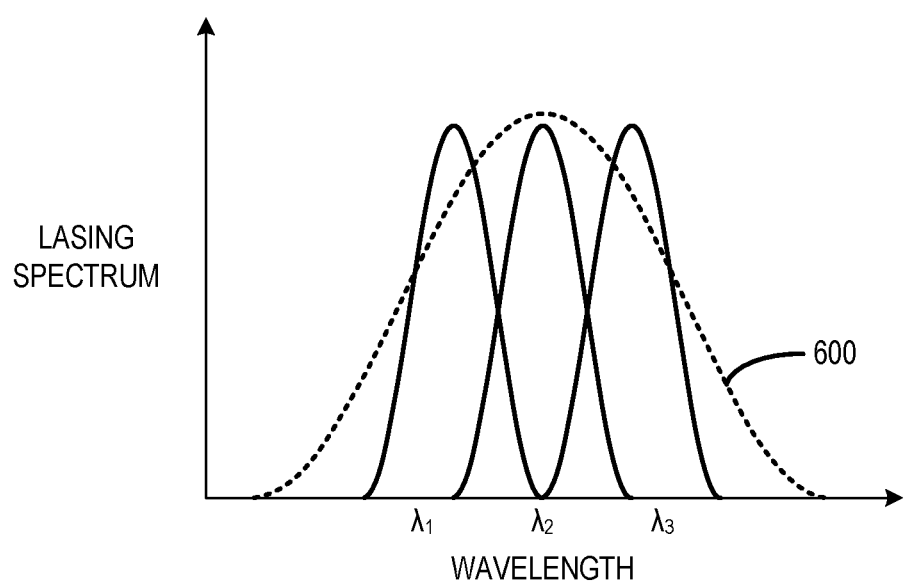
FIG. 6 shows a plurality of example lasing spectra at different wavelengths and an example time averaged lasing spectrum of the plurality of different lasing spectra.

The controller 420 may be configured to modulate the refractive index of the reflector section 406 to reflect light at different wavelengths at a relatively high frequency. As one example, the controller 420 may be configured to switch the reflector section 406 between different wavelengths with a high enough frequency that the effective spectrum of coherent light lased from the laser assembly 400 would have a perceived bandwidth that is wider than any of the individual wavelengths. For example, as shown in FIG. 6, the controller 420 may be configured to modulate the voltage of a waveform applied to the reflector section 406 to rapidly switch between reflecting light having wavelengths $\lambda_1$, $\lambda_2$, and $\lambda_3$. The controller 420 may be configured to modulate the voltage of a waveform applied to the reflector section 406 at a frequency suitably high enough to produce a time averaged lasing spectrum 600 of the plurality of different lasing spectra with a perceived bandwidth that is substantially wider than each of the individual spectra corresponding to $\lambda_1$, $\lambda_2$, and $\lambda_3$.

Figure 7:
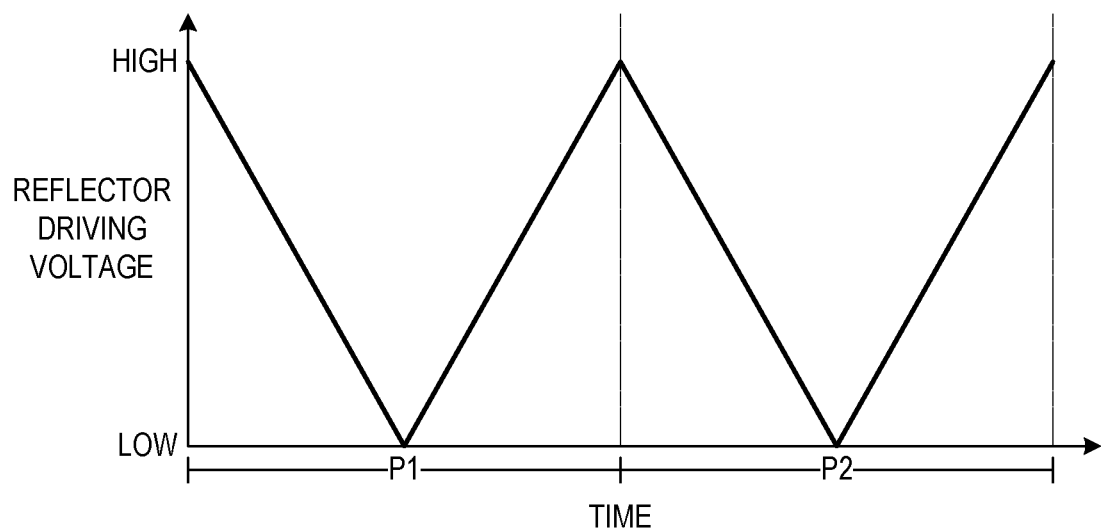
FIG. 7 show an example reflector modulation voltage drive scheme over two periods.
Figure 8:
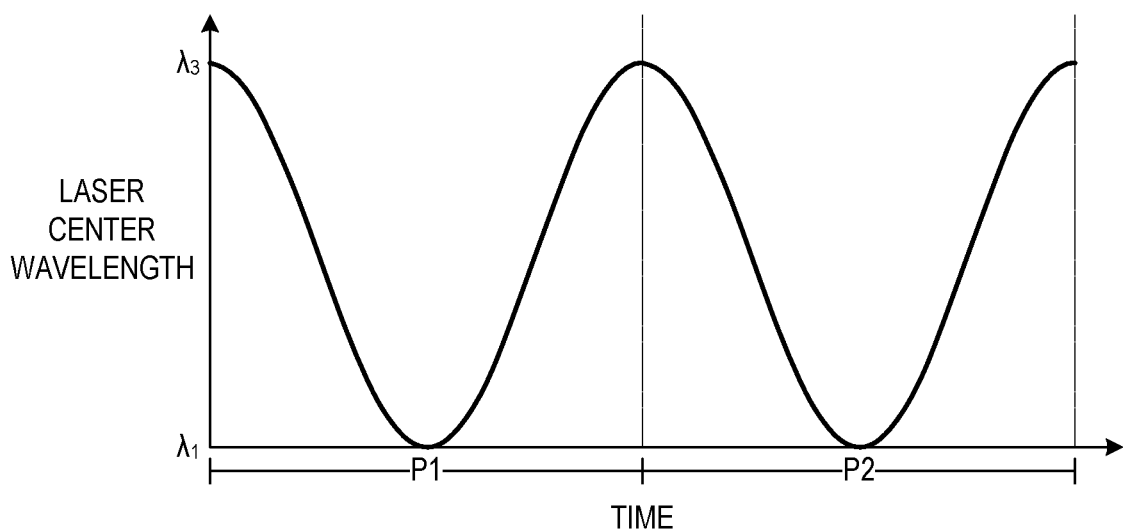
FIG. 8 shows laser central wavelength modulation over two periods based on the reflector modulation voltage drive scheme shown in FIG. 7.

The controller 420 may be configured to modulate the reflector section 406 to switch between reflecting light at different wavelengths at any suitable frequency. In one example where the laser assembly 400 is configured to lase coherent light to a display including a plurality of pixels (e.g., near-eye display system 200 shown in FIG. 2), the controller 420 may be configured to modulate the voltage of a waveform applied to the reflector section 406 at least on a per pixel basis (e.g., rapidly switch between different wavelengths in less than one pixel time) for each of the plurality of pixels of the display. FIG. 7 show an example reflector modulation voltage drive scheme in which the controller 420 periodically modulates the voltage of a waveform applied to the reflector section 406 over two periods. In one example, a period is equivalent to twice a pixel time at which a pixel is scanned for a display (e.g., ~10 nanoseconds). In each period (e.g., P1, P2), the voltage is modulated as a triangle wave from a high voltage to a low voltage and back to the high voltage. FIG. 8 shows corresponding laser wavelength modulation over two periods based on the reflector modulation voltage drive scheme shown in FIG. 7. The high voltage in the drive scheme corresponds to selecting a lasing central wavelength $\lambda_3$ and the low voltage corresponds to selecting a lasing central wavelength $\lambda_1$. According to such a drive scheme, the lasing central wavelength can be modulated to have a perceived bandwidth between $\lambda_1$ and $\lambda_3$ which may be wider than any single wavelength spectra. In the depicted example, the central wavelength is sinusoidally modulated. In other examples, the central wavelength may be differently modulated. Using the example of FIGS. 7 and 8, in P1 the lasing central wavelength is modulated from $\lambda_3$ to $\lambda_1$ to have a perceived bandwidth between $\lambda_1$ and $\lambda_3$ for a first pixel. Then, still in P1, the lasing central wavelength is modulated from $\lambda_1$ to $\lambda_3$ to have a perceived bandwidth between $\lambda_1$ and $\lambda_3$ for a second pixel. In P2, the lasing central wavelength is modulated from $\lambda_3$ to $\lambda_1$ to have a perceived bandwidth between $\lambda_1$ and $\lambda_3$ for a third pixel. Then, still in P2, the lasing central wavelength is modulated from $\lambda_1$ to $\lambda_3$ to have a perceived bandwidth between $\lambda_1$ and $\lambda_3$ for a fourth pixel.

Increasing the perceived laser bandwidth may address a variety of issues for a laser-based display. For example, increasing the laser bandwidth via high-frequency modulation may cause a large number of wavelengths in the laser spectrum to interfere and the superposition of all the wavelengths may result in a washout of contrast for interference fringes. In this way, fringe interference artifacts in images presented by such a laser-based display may be reduced. As another example, increasing the laser bandwidth may cause light inside a waveguide to couple out at a larger range of angles causing overlap of different wavelengths that blur out FOV boundaries. In this way, image quality of images presented by such a laser-based display may be improved.

Figure 9:
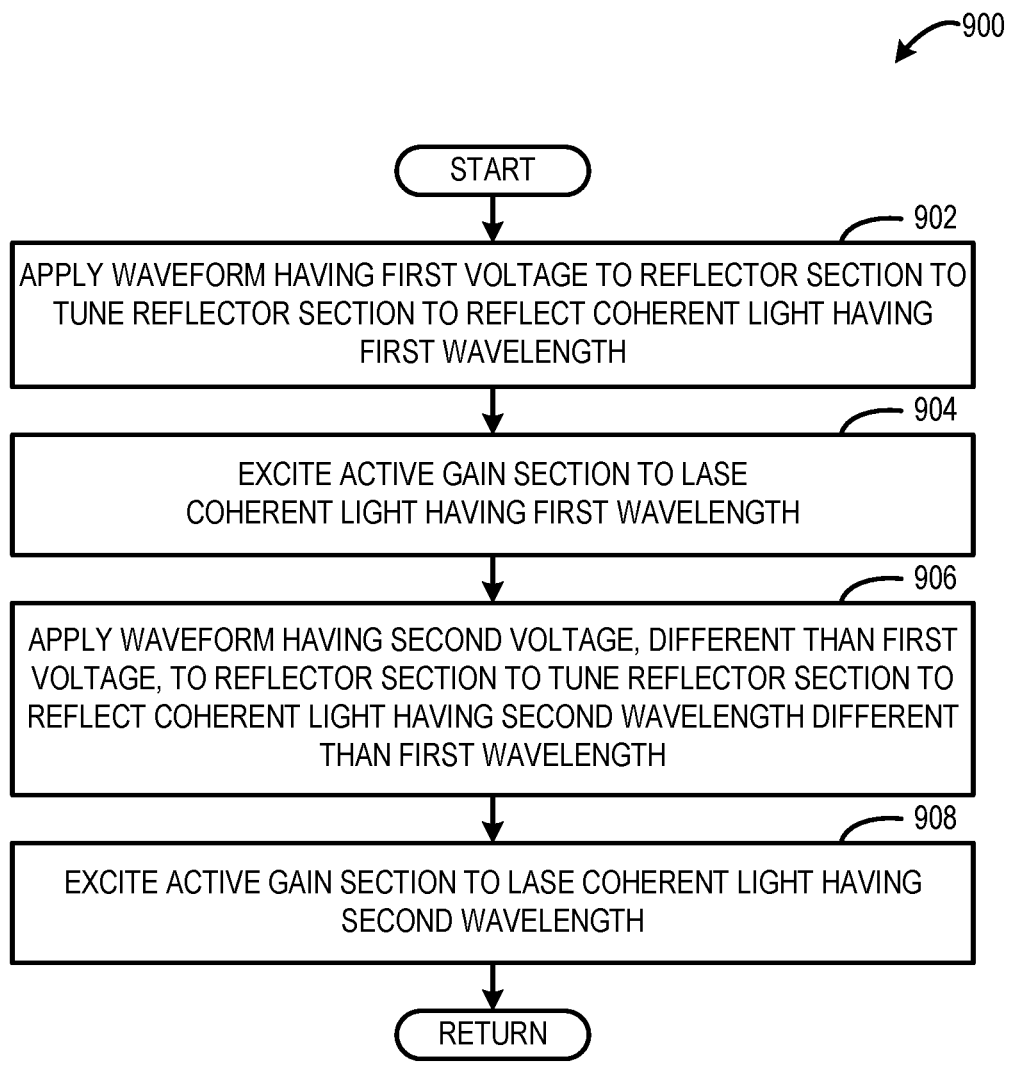
FIG. 9 shows a flowchart depicting an example method for controlling an edge-emitting laser to lase coherent light in a selected wavelength that is tunable within a wavelength range.

FIG. 9 shows an example method 900 for operating an edge-emitting laser, such as the laser assemblies 202 and 400 shown in FIGS. 2 and 4. For example, the method 900 may be performed by the near-eye display system 100 shown in FIG. 1, and/or the controller 220 shown in FIG. 2. At 902, the method 900 includes applying a waveform having a first voltage to a reflector section of an optical cavity of the edge-emitting laser to tune the reflector section to reflect coherent light having a first wavelength. The reflector section may be configured to selectively reflect light of a selected wavelength, wherein the selected wavelength is tunable via high-frequency index modulation of the reflector section. At 904, the method 900 includes exciting an active gain section of the optical cavity of the edge-emitting laser to lase coherent light having the first wavelength. At 906, the method 900 includes applying a waveform having a second voltage, different than the first voltage, to the reflector section to tune the reflector section to reflect coherent light having a second wavelength different than the first wavelength. At 908, the method 900 includes exciting the active gain section to lase coherent light having the second wavelength.

In some implementations, the method 900 may be repeatedly performed. In some implementations, the method 900 may be repeatedly performed at a frequency suitably high enough to widen a perceived bandwidth of the coherent light lased from the edge-emitting laser. In some implementations wherein the edge-emitting laser is configured to lase the coherent light to a display including a plurality of pixels, the method 900 may be repeatedly performed at a frequency that is at least on a per pixel basis to lase coherent light to each of the plurality of pixels of the display.

Figure 10:
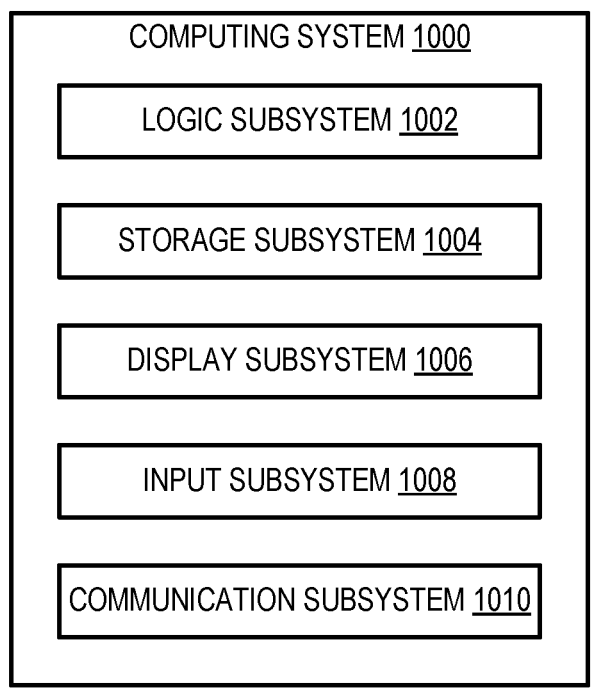
FIG. 10 schematically shows an example computing system.

FIG. 10 schematically shows a simplified representation of a computing system 1000 configured to provide any to all of the compute functionality described herein. Computing system 1000 may take the form of one or more head-mounted, near-eye display devices, personal computers, network-accessible server computers, tablet computers, home-entertainment computers, gaming devices, mobile computing devices, mobile communication devices (e.g., smart phone), virtual/augmented/mixed reality computing devices, wearable computing devices, Internet of Things (IoT) devices, embedded computing devices, and/or other computing devices. For example, computing system 1000 may be representative of the head-mounted electronic device 102 in FIG. 1.

Computing system 1000 includes a logic subsystem 1002 and a storage subsystem 1004. Computing system 1000 may optionally include a display subsystem 1006, input subsystem 1008, communication subsystem 1010, and/or other subsystems not shown in FIG. 10.

Logic subsystem 1002 includes one or more physical devices configured to execute instructions. For example, the logic subsystem 1002 may be configured to execute instructions that are part of one or more applications, services, or other logical constructs. The logic subsystem 1002 may include one or more hardware processors configured to execute software instructions. Additionally or alternatively, the logic subsystem 1002 may include one or more hardware or firmware devices configured to execute hardware or firmware instructions. Processors of the logic subsystem 1002 may be single-core or multi-core, and the instructions executed thereon may be configured for sequential, parallel, and/or distributed processing. Individual components of the logic subsystem 1002 optionally may be distributed among two or more separate devices, which may be remotely located and/or configured for coordinated processing. Aspects of the logic subsystem 1002 may be virtualized and executed by remotely-accessible, networked computing devices configured in a cloud-computing configuration.

Storage subsystem 1004 includes one or more physical devices configured to temporarily and/or permanently hold computer information such as data and instructions executable by the logic subsystem 1002. When the storage subsystem 1004 includes two or more devices, the devices may be collocated and/or remotely located. Storage subsystem 1004 may include volatile, nonvolatile, dynamic, static, read/write, read-only, random-access, sequential-access, location-addressable, file-addressable, and/or content-addressable devices. Storage subsystem 1004 may include removable and/or built-in devices. When the logic subsystem 1002 executes instructions, the state of storage subsystem 1004 may be transformed—e.g., to hold different data.

Aspects of logic subsystem 1002 and storage subsystem 1004 may be integrated together into one or more hardware-logic components. Such hardware-logic components may include program- and application-specific integrated circuits (PASIC/ASICs), program- and application-specific standard products (PSSP/ASSPs), system-on-a-chip (SOC), and complex programmable logic devices (CPLDs), for example.

The logic subsystem 1002 and the storage subsystem 1004 may cooperate to instantiate one or more logic machines. As used herein, the term "machine" is used to collectively refer to the combination of hardware, firmware, software, instructions, and/or any other components cooperating to provide computer functionality. In other words, "machines" are never abstract ideas and always have a tangible form. A machine may be instantiated by a single computing device, or a machine may include two or more sub-components instantiated by two or more different computing devices. In some implementations a machine includes a local component (e.g., software application executed by a computer processor) cooperating with a remote component (e.g., cloud computing service provided by a network of server computers). The software and/or other instructions that give a particular machine its functionality may optionally be saved as one or more unexecuted modules on one or more suitable storage devices. As examples, the logic subsystem 1002 and the storage subsystem 1004 may be implemented as a controller, such as controller 220 shown in FIGS. 2 and 4.

When included, display subsystem 1006 may be used to present a visual representation of data held by storage subsystem 1004. This visual representation may take the form of a graphical user interface (GUI). Display subsystem 1006 may include one or more display devices utilizing virtually any type of technology. In some implementations, display subsystem may include one or more virtual-, augmented-, or mixed reality displays. As an example, display subsystem 1006 may be implemented as the near-eye display system 100 shown in FIG. 1 and/or the near-eye display system 200 shown in FIG. 2.

When included, input subsystem 1008 may comprise or interface with one or more input devices. An input device may include a sensor device or a user input device. Examples of user input devices include a keyboard, mouse, touch screen, or game controller. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition.

When included, communication subsystem 1010 may be configured to communicatively couple computing system 1000 with one or more other computing devices. Communication subsystem 1010 may include wired and/or wireless communication devices compatible with one or more different communication protocols. The communication subsystem 1010 may be configured for communication via personal-, local- and/or wide-area networks.

In an example, edge-emitting laser comprises an active gain section configured to amplify an optical power of light across a wavelength range, and a reflector section optically coupled to the active gain section and configured to selectively reflect light of a selected wavelength within the wavelength range, wherein the selected wavelength is tunable via high-frequency index modulation of the reflector section, wherein the active gain section and the reflector section collectively form an optical cavity configured to lase coherent light in the selected wavelength. In this example and/or other examples, the reflector section may include a grating-based filter. In this example and/or other examples, the grating-based filter may be a Distributed Bragg Reflector. In this example and/or other examples, the reflector section may include electro-optic material configured to modulate a reflective index of the reflector section as a function of a voltage of a waveform applied to the electro-optic material. In this example and/or other examples, the edge-emitting laser may further comprise a controller configured to modulate a voltage of a waveform applied to the reflector section to tune the selected wavelength of the coherent light lased by the optical cavity. In this example and/or other examples, the controller may be configured to periodically modulate the voltage of the waveform applied to the reflector section. In this example and/or other examples, the controller may be configured to modulate the voltage of the waveform applied to the reflector section to sinusoidally modulate the selected wavelength within the wavelength range. In this example and/or other examples, the edge-emitting laser may be configured to lase the coherent light to a display including a plurality of pixels, and the controller may be configured to modulate the voltage of the waveform applied to the reflector section at least on a per pixel basis for the plurality of pixels of the display. In this example and/or other examples, the controller may be configured to modulate the voltage of the waveform applied to the reflector section at a frequency suitably high enough to widen a perceived bandwidth of the coherent light. In this example and/or other examples, the edge-emitting laser may be configured to lase coherent light into a waveguide, and the controller may be configured to tune the perceived bandwidth of the coherent light to reduce fringe interference due to the coherent light propagating through the waveguide.

In an example, an edge-emitting laser comprises an active gain section configured to amplify an optical power of light across a wavelength range, and a reflector section optically coupled to the active gain section and configured to selectively reflect light of a selected wavelength within the wavelength range, wherein the selected wavelength is tunable via high-frequency index modulation of the reflector section, wherein the active gain section and the reflector section collectively form an optical cavity configured to lase coherent light in the selected wavelength, and a controller configured to modulate a voltage of a waveform applied to the reflector section to tune the selected wavelength of the coherent light lased by the optical cavity. In this example and/or other examples, the controller may be configured to periodically modulate the voltage of the waveform applied to the reflector section. In this example and/or other examples, the controller may be configured to modulate the voltage of the waveform applied to the reflector section to sinusoidally modulate the selected wavelength within the wavelength range. In this example and/or other examples, the edge-emitting laser may be configured to lase the coherent light to a display including a plurality of pixels, and the controller may be configured to modulate the voltage of the waveform applied to the reflector section at least on a per pixel basis for the plurality of pixels of the display. In this example and/or other examples, the controller may be configured to modulate the voltage of the waveform applied to the reflector section at a frequency suitably high enough to widen a perceived bandwidth of the coherent light. In this example and/or other examples, the edge-emitting laser may be configured to lase coherent light into a waveguide, and the controller may be configured to tune a perceived bandwidth of the coherent light to reduce fringe interference due to the coherent light propagating through the waveguide.

In an example, a method for operating an edge-emitting laser having an optical cavity including an active gain section and a reflector section configured to selectively reflect light of a selected wavelength tunable via high-frequency index modulation of the reflector section, comprises applying a waveform having a first voltage to the reflector section to tune the reflector section to reflect coherent light having a first wavelength, exciting the active gain section to lase coherent light having the first wavelength, applying a waveform having a second voltage, different than the first voltage, to the reflector section to tune the reflector section to reflect coherent light having a second wavelength different than the first wavelength, and exciting the active gain section to lase coherent light having the second wavelength. In this example and/or other examples, the reflector section may be tuned periodically between reflecting coherent light having the first wavelength and reflecting coherent light having the second wavelength. In this example and/or other examples, the reflector section may be tuned between reflecting coherent light having the first wavelength and reflecting coherent light having the second wavelength at a frequency suitably high enough to widen a perceived bandwidth of the coherent light. In this example and/or other examples, the edge-emitting laser may be configured to lase the coherent light to a display including a plurality of pixels, and the reflector section may be tuned between reflecting coherent light having the first wavelength and reflecting coherent light having the second wavelength at least on a per pixel basis for the plurality of pixels of the display.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. An edge-emitting laser, comprising:
an active gain section configured to amplify an optical power of light across a wavelength range;
a reflector section optically coupled to the active gain section and configured to selectively reflect light of a selected wavelength within the wavelength range, wherein the selected wavelength is tunable via high-frequency index modulation of the reflector section,
wherein the active gain section and the reflector section collectively form an optical cavity configured to lase coherent light in the selected wavelength to a display including a plurality of pixels; and
a controller configured to modulate a voltage of a waveform applied to the reflector section to tune the selected wavelength of the coherent light lased by the optical cavity at least on a per pixel basis for the plurality of pixels of the display.

2. The edge-emitting laser of claim 1, wherein the reflector section includes a grating-based filter.

3. The edge-emitting laser of claim 2, wherein the grating-based filter is a Distributed Bragg Reflector.

4. The edge-emitting laser of claim 1, wherein the reflector section includes electro-optic material configured to modulate a reflective index of the reflector section as a function of the voltage of the waveform applied to the electro-optic material.

5. The edge-emitting laser of claim 1, wherein the controller is configured to periodically modulate the voltage of the waveform applied to the reflector section.

6. The edge-emitting laser of claim 1, wherein the controller is configured to modulate the voltage of the waveform applied to the reflector section to sinusoidally modulate the selected wavelength within the wavelength range.

7. The edge-emitting laser of claim 1, wherein the controller is configured to modulate the voltage of the waveform applied to the reflector section at a frequency suitably high enough to widen a perceived bandwidth of the coherent light.

8. The edge-emitting laser of claim 7, wherein the edge-emitting laser is configured to lase coherent light into a waveguide, and wherein the controller is configured to tune the perceived bandwidth of the coherent light to reduce fringe interference due to the coherent light propagating through the waveguide.

9. An edge-emitting laser, comprising:
an active gain section configured to amplify an optical power of light across a wavelength range;
a reflector section optically coupled to the active gain section and configured to selectively reflect light of a selected wavelength within the wavelength range, wherein the selected wavelength is tunable via high-frequency index modulation of the reflector section,
wherein the active gain section and the reflector section collectively form an optical cavity configured to lase coherent light in the selected wavelength to a display including a plurality of pixels; and
a controller configured to modulate a voltage of a waveform applied to the reflector section to tune the selected wavelength of the coherent light lased by the optical cavity between a plurality of different lasing spectra at a frequency to produce a time average lasing spectrum of the plurality of different lasing spectra at each pixel with a perceived bandwidth that is wider than each of the individual different lasing spectra.

10. The edge-emitting laser of claim 9, wherein the controller is configured to periodically modulate the voltage of the waveform applied to the reflector section.

11. The edge-emitting laser of claim 9, wherein the controller is configured to modulate the voltage of the waveform applied to the reflector section to sinusoidally modulate the selected wavelength within the wavelength range.

12. The edge-emitting laser of claim 9, wherein the controller is configured to modulate the voltage of the waveform applied to the reflector section at a frequency suitably high enough to widen the perceived bandwidth of the coherent light.

13. The edge-emitting laser of claim 9, wherein the edge-emitting laser is configured to lase coherent light into a waveguide, and wherein the controller is configured to tune the perceived bandwidth of the coherent light to reduce fringe interference due to the coherent light propagating through the waveguide.

14. A method for operating an edge-emitting laser having an optical cavity including an active gain section and a reflector section configured to selectively reflect light of a selected wavelength tunable via high-frequency index modulation of the reflector section, the method comprising:

applying a waveform having a first voltage to the reflector section to tune the reflector section to reflect coherent light having a first wavelength;

exciting the active gain section to lase coherent light having the first wavelength to a display including a plurality of pixels;

applying a waveform having a second voltage, different than the first voltage, to the reflector section to tune the reflector section to reflect coherent light having a second wavelength different than the first wavelength; and exciting the active gain section to lase coherent light having the second wavelength to the display;

wherein the reflector section is tuned between reflecting coherent light having the first wavelength and reflecting coherent light having the second wavelength at least on a per pixel basis for the plurality of pixels of the display.

15. The method of claim 14, wherein the reflector section is tuned periodically between reflecting coherent light having the first wavelength and reflecting coherent light having the second wavelength.

16. The method of claim 14, wherein the reflector section is tuned between reflecting coherent light having the first wavelength and reflecting coherent light having the second wavelength at a frequency suitably high enough to widen a perceived bandwidth of the coherent light.

* * * * *